US 8,003,008 B1

United States Patent
Huebner et al.

(10) Patent No.: US 8,003,008 B1
(45) Date of Patent: Aug. 23, 2011

(54) COLOR-TAILORED POLYMER LIGHT EMITTING DIODES INCLUDING EMISSIVE COLLOIDAL PARTICLES AND METHOD OF FORMING SAME

(75) Inventors: Christopher F. Huebner, Clemson, SC (US); David D. Evanoff, Cullowhee, NC (US); Joseph B. Carroll, Bradford, MA (US); Stephan H. Foulger, Clemson, SC (US)

(73) Assignee: Clemson University, Clemson, SC (US)

( * ) Notice: Subject to any disclaimer, the term of this patent is extended or adjusted under 35 U.S.C. 154(b) by 104 days.

(21) Appl. No.: 12/247,270

(22) Filed: Oct. 8, 2008

Related U.S. Application Data (60) Provisional application No. 60/978,211, filed on Oct. 8, 2007.

(51) Int. Cl.
*C09K 11/06* (2006.01)
(52) U.S. Cl. .................. 252/301.16; 428/917
(58) Field of Classification Search ............. 252/301.16; 428/917
See application file for complete search history.

(56) References Cited

U.S. PATENT DOCUMENTS

| | | | |
|---|---|---|---|
| 4,720,432 A | 1/1988 | VanSlyke et al. |
| 4,769,292 A | 9/1988 | Tang et al. |
| 5,030,532 A | 7/1991 | Limburg et al. |
| 5,231,329 A | 7/1993 | Nishikitami et al. |
| 5,247,190 A | 9/1993 | Friend et al. |
| 5,552,678 A | 9/1996 | Tang et al. |
| 5,554,450 A | 9/1996 | Shi et al. |
| 5,707,745 A | 1/1998 | Forrest et al. |
| 5,728,801 A | 3/1998 | Wu et al. |
| 5,812,300 A | 9/1998 | Coleman |
| 6,165,388 A | 12/2000 | Coleman |
| 6,348,359 B1 | 2/2002 | Van Slyke et al. |
| 6,501,587 B1 | 12/2002 | Ferraris et al. |
| 6,590,125 B2 | 7/2003 | Hwang et al. |
| 6,597,012 B2 | 7/2003 | Kido et al. |
| 6,833,201 B2 | 12/2004 | Czerw et al. |
| 6,861,497 B2 | 3/2005 | Lindsay et al. |
| 6,869,695 B2 | 3/2005 | Thompson et al. |
| 7,008,556 B2 | 3/2006 | Casasanta, III et al. |
| 7,078,113 B2 | 7/2006 | Thompson et al. |
| 7,205,366 B2 | 4/2007 | Jaycox et al. |
| 2004/0100189 A1 | 5/2004 | Adachi et al. |
| 2005/0019604 A1 | 1/2005 | Thompson et al. |
| 2007/0254981 A1 | 11/2007 | DiMaio et al. |

OTHER PUBLICATIONS

Chem. Abstract citation 2006:245700: Hayes et al, "Convergent synthesis of poly(methyl methacrylate) (PMMA) based electroluminescent colloids", Abstracts of Papers, 231$^{st}$ ACS National Meeting, Atlanta GA, Mar. 26-30, 2006.*

(Continued)

*Primary Examiner* — C. Melissa Koslow
(74) *Attorney, Agent, or Firm* — Dority & Manning, P.A.

(57) ABSTRACT

Color-tailored and white-light emitting polymer colloid-based OLEDs are disclosed. Devices include electroluminescent (EL) colloidal conductive polymer systems that can include EL dyes or other EL materials. Systems can sequester multiple EL components in different colloids in a single emissive layer of an EL device with little or no appreciable energy transfer between colloids. Devices can exhibit tailored emissions over a broad range of wavelengths through mixing of, e.g., red, green and blue PLED colloids. Disclosed methods including incorporation of one or more electroluminescent dyes into a semiconductive EL polymer colloid that can isolate the dyes and prevent energy transfer while retaining individual color emission.

15 Claims, 6 Drawing Sheets

OTHER PUBLICATIONS

Huebner et al, "Materials engineering and fabrication of collodally based, color tailorable organic light emitting devices", Abstracts of Papers, 234st ACS National Meeting, Boston MA, Aug. 19-23, 2007.*

Han, et al., "Polyaniline coated poly(butyl methacrylate) core-shell particles: roll-to-roll printing of templated electrically conductive structures", *Journal of Materials Chemistry*, vol. 17, (2007), pp. 1-7.

Han, et al., "Crystalline Colloidal Arrays Composed of Poly(3,4-ethylenedioxythiophene)-Coated Polystyrene Particles with a Stop Band in the Visible Regime", *Advanced Materials*, vol. 16, 3 (2004), pp. 231-234.

Han, et al. "Preparation of poly(3,4-ethylenedioxythiophene) (PEDOT) coated silica core-shell particles and PEDOT hollow particles", *ChemComm*, 19, 2154 (2004).

Moon Gyu Han, et al., "Synthesis of Poly(3,4-ethylenedioxythiophene)/Silica Colloidal Nanocomposites," *Langmuir The ACS Journal of Surfaces and Colloids*, May 27, 2003, vol. 19, No. 11, p. 4523.

Shim, et al., "Inkjet Printed Electrochromic Polyaniline Layer for the Fabrication of Electrochromic Devices," *Polymeric Materials: Science & Engineering*, 2006, vol. 94, p. 877.

Jiang, et al., "Statistical Copolymers with Side-Chain Hole and Electron Transport Groups for Single-Layer Electroluminescent Device Applications", *Chem. Mater.* 12, pp. 2542-2549 (2000).

* cited by examiner

COLOR-TAILORED POLYMER LIGHT EMITTING DIODES INCLUDING EMISSIVE COLLOIDAL PARTICLES AND METHOD OF FORMING SAME

CROSS REFERENCE TO RELATED APPLICATION

The present application claims filing benefit of U.S. provisional patent application Ser. No. 60/978,211 filed on Oct. 8, 2007, which is incorporated herein by reference in its entirety.

FEDERALLY SPONSORED RESEARCH AND DEVELOPMENT

The United States Government may have rights in this invention pursuant to CAREER Award Grant #20-201-5100-206-2003498 and National Science Foundation Contract #DMR-0236692.

BACKGROUND OF THE INVENTION

The past two decades have seen a growing interest in developing all-organic light-emitting devices as alternatives to inorganic based systems. The advantages of organic small molecules and light-emitting polymers for these devices include lower synthesis costs of the materials as well as the devices. In addition, most organic light emitting diode (OLED) materials have been shown amenable to large scale-up and provide high efficiency output. In 1987, researchers at Kodak developed OLEDs based on small organic molecules (see, e.g., U.S. Pat. No. 4,720,432 to Van Slyke, et al.); however, formation methods required an expensive vacuum deposition process. In the early 1990s, polymer based LED (PLED) devices were developed employing a $\pi$-conjugated poly(phenylene vinylene) polymer (see, e.g., U.S. Pat. No. 5,247,190 to Friend, et al.).

Despite the many advantages to using small molecules and polymers for OLEDs, the ability to create devices with distinct emissions over a broad range of wavelengths has required difficult and lengthy synthetic protocols or complex device fabrication techniques unfavorable for large scale-up and low manufacturing costs.

An alternative to the use of small molecules and $\pi$-conjugated polymers has been explored through creation of multilayer emissive materials that contain both a hole and an electron transport component which have been doped with an electroluminescent (EL) dye (Jiang, et al., *Chem. Mater.*, 12:2542, 2000). For single colored emission, these systems have shown promise in thin film devices. However, independent EL dye emissions from a polymeric film containing several EL dyes remains problematic due to documented energy transfer processes which can occur between proximal dye molecules.

What is needed in the art are PLEDs that can successfully incorporate multiple EL dyes so as to provide color-tailorable PLEDs that can effectively emit a wider variety of colors, including white light.

SUMMARY

According to one embodiment, disclosed is an electroluminescent colloid comprising a hole transport material and an electron transport material. More specifically, at least one of the hole transport material and the electron transport material is a polymer, and the colloid can be homogeneous in nature.

A colloid includes an electroluminescent material, and in one embodiment, includes only a single electroluminescent material. For example, an electroluminescent material can be the hole transport material, the electron transport material, or an electroluminescent dye. For instance, one of the electron transport material and the hole transport material can be a light emitting conjugated polymer.

Also disclosed herein are methods of forming a dispersion of electroluminescent colloids. By way of example, a method can include forming a solution including the hole transport material, the electron transport material, and, in one embodiment, also including an electroluminescent dye, combining the solution with an aqueous phase to form a biphasic mixture, and subjecting the biphasic mixture to high shear forces such that a dispersion of electroluminescent colloids is formed.

Methods can include additional steps as well, such as removing the solvent from the dispersion, separating the colloids from the aqueous phase, and redispersing the separated colloids in a liquid. For example, the separated colloids can be redispersed in a liquid with other colloids having different electroluminescent characteristics, i.e., colloids that emit at a different wavelength, to provide a dispersion capable of emitting a color that is different from that of either of the EL materials alone.

Systems of colloids can be utilized to form printable inks including, without limitation, ink jet inks and flexographic inks. For instance, in addition to a dispersion of colloids (either all describing the same electroluminescent characteristics or a mixture of colloids with different electroluminescent characteristics, as desired) and a liquid carrier, an ink can include typical ink additives appropriate for the desired application such as a humectant, a penetrating agent, a drying agent, a surfactant, a plasticizer, or combinations thereof.

Disclosed systems can be used to form an electroluminescent device. A device can include, for example, a first layer including a plurality of the electroluminescent colloids, a cathode, and an anode. In one embodiment, the layer of colloids can also include a binder encapsulating the colloids. The binder can include a transparent polymer. In general, at least one of the cathode and anode can be transparent. In addition, the cathode and/or the anode can be formed as additional layers of the device partially or completely covering the layer including the colloids.

BRIEF DESCRIPTION OF THE FIGURES

A full and enabling disclosure of the present invention, including the best mode thereof, to one of ordinary skill in the art, is set forth more particularly in the remainder of the specification, including reference to the accompanying figures, in which.

DETAILED DESCRIPTION

Reference will now be made in detail to various embodiments of the disclosed subject matter, one or more examples of which are set forth below. Each embodiment is provided by way of explanation of the subject matter, not limitation thereof. In fact, it will be apparent to those skilled in the art that various modifications and variations may be made in the present subject matter without departing from the scope or spirit of the disclosure. For instance, features illustrated or described as part of one embodiment, may be used with another embodiment to yield a still further embodiment.

In one embodiment, the present disclosure is directed to facile routes to producing color-tailored and white-light emitting polymer colloid-based OLEDs. Disclosed methods include the preparation of electroluminescent (EL) compound-containing colloidal conductive polymer systems as well as techniques for fabrication of emissive devices incorporating the colloidal polymer systems.

Beneficially, disclosed colloidal systems can sequester multiple EL dye components in a single layer with little or no appreciable energy transfer between individual colloids. This capability provides a route to create tailored emissions from a single layer over a broad range of wavelengths through mixing of, e.g., red, green and blue PLED materials. For instance, encapsulation of an EL dye within a semiconductive polymer colloid can provide an emissive material that is effectively blocked from energetic communication with other PLED colloids in the same layer of an emissive device. Disclosed systems and devices can be beneficially utilized in numerous applications and industries including, without limitation, automotive lighting, decorative lighting, marketing (including point-of-purchase advertising and product packaging) and other novelty luminaire manufacturing.

In general, a polymeric colloid of disclosed systems can include at least one hole transport component, at least one electron transport component, and, in one embodiment, an EL dye, wherein at least one of the hole transport component and the electron transport component is a polymer.

Any hole transport material and electron transport material as are generally known in the art may be utilized in the disclosed colloidal systems. Hole transport materials can include, for example, materials that show hole mobilities of greater than about $10^{-3}$ $cm^2V^{-1}$ $s^{-1}$. Electron transport materials can include, in one embodiment, materials that show mobilities between about $10^{-3}$ and about $10^{-1}$ $cm^2V^{-1}$ $s^{-1}$.

Small molecule hole transport materials can include, without limitation, 4,4'-bis[N-(naphthyl)-N-phenyl-amino]biphenyl (α-NPD); N,N'-bis(3-methylphenyl)-N,N'-diphenyl-[1,1'-biphenyl]4,4'-diamine (TPD); 4,4'-bis[N-(2-naphthyl)-N-phenyl-amino]biphenyl (β-NPD); 4,4'-bis[N,N'-(3-tolyl) amino]-3,3'-dimethylbiphenyl (HMTPB); 4,4',4"-tris(3 methylphenylphenylamino)triphenylamine (MTDATA); 3,3'-Dimethyl-$N^4,N^4,N^{4'},N^{4'}$-tetra-p-tolylbiphenyl-4,4'-diamine (R854); N,N'-meta-dicarbazoloylbenzene (mCP); N,N',N"-1,3,5-tricarbazoloylbenzene (tCP); 4,4'-N,N'-dicarbazole-biphenyl (CBP); and the like.

Small molecule electron transport materials may include, for example, aryl-substituted oxadiazole, aryl-substituted triazole, aryl-substituted phenanthroline, benzoxazole or benzothiazole compounds, such as 1,3-bis(N,N-t-butyl-phenyl)-1,3,4-oxadiazole (OXD-7); 3-phenyl-4-(1'-naphthyl)-5-phenyl-1,2,4-triazole (TAZ); 2,9-dimethyl-4,7-diphenyl-phenanthroline (bathocuproine or BCP); bis(2-(2-hydroxyphenyl)-benzoxazolate)zinc; (2-(2-hydroxyphenyl)-benzothiazolate)zinc; (2-(4-tert-butylphenyl)-5-(4-biphenylyl)-1,3,4-oxadiazole (PBD); aluminum tris(8-hydroxyquinolate) (Alq3); and the like.

In one embodiment, disclosed electroluminescent colloids can be formed from conjugated polymer systems. For example, at least one of an electron transport material or a hole transport material can be a polymeric charge transport material. However, as is known in the art, conjugated polymers are generally ambipolar and form electron rich and electron deficient areas when under a bias. Accordingly, in one embodiment, a first area of a conjugated polymer can function as an electron transport material and a second area of a conjugated polymer can function as a hole transport material. Accordingly, in one embodiment, a colloid can be formed of an EL conjugated polymer alone, without additional EL materials. According to another embodiment, a colloid can include a conjugated polymer, which provides both the electron transport component and the hole transport component, and can also include an EL dye component.

In one embodiment, a colloid system can be formed to include a light emitting conjugated polymer such as, for example, conductive π-conjugated poly(phenylene vinylene) derivatives such as poly[2-methoxy-5-(2-ethylhexyloxy)-1, 4-phenylenevinylene] (MEH-PPV), or poly(phenylene ethylene) (PPE) light emitting polymers, and the like. In such an embodiment, an at least semiconductive light emitting colloid need not also contain a luminescent dye.

Multiple polymeric charge transport materials as may be incorporated in disclosed colloids are generally known in the art. For example, charge transport polymers including polyanilines, polythiophenes, polypyrroles, polyarylamines, polycarbazoles, and the like can be utilized. In one embodiment, poly(9-vinylcarbazole) (PVK) can be utilized as a polymeric hole transport material. Other polymers as may be utilized as electron transport materials and/or hole transport materials in colloidal systems as disclosed herein can include those described in U.S. Pat. No. 5,030,532 to Limburg, et al., U.S. Pat. No. 5,231,329 to Nishikitani, et al., U.S. Pat. No. 6,590, 125 to Hwang, et al., U.S. Pat. No. 6,597,012 to Kido, et al., 6,861,497 to Lindsay, et al., and U.S. Pat. No. 7,205,366 to Jaycox, et al., all of which are incorporated herein by reference.

Electroluminescent dyes as may be incorporated into disclosed colloidal systems can generally include any EL dye as is generally known in the art. For instance, incorporated EL dyes can include, without limitation, phosphorescent materials, in which emission occurs from a triplet excited state of an organic molecule, as well as fluorescent materials, in which emission occurs from a singlet excited state of an organic molecule. For example, derivatives of coumarin, rhodamine, phenoxazone, flourescein, and the like can be incorporated into the disclosed colloids.

Electroluminescent colloids as described herein can be formed in one embodiment according to a miniemulsion process. In general, a miniemulsion process can include the creation of a dispersion of colloids having a diameter on the order of from about 20 nm to about 500 nm in an aqueous phase. A dispersion of colloids can be formed through the introduction of high shear forces to a biphasic mixture via, e.g., sonication. For example, a first solution including desired colloid components, e.g., at least one hole transport component, at least one electron transport component, and an EL dye, can be formed in a suitable organic solvent. In general, polymeric and small molecule components of a colloid system can be at least as hydrophobic as the solvent and the solvent can be suitably hydrophobic so as to form a biphasic mixture upon combination of the organic solution with an aqueous phase.

The hole transport component and the electron transport component can be provided in an organic solution in relative amounts that can provide balanced charge injection into and transport through an emissive material including the formed colloidal system. For example, the ratio of a hole transport component to the electron transport component can be provided in the desired ratio for the emissive material, e.g., about 7:3 by weight, in an embodiment in which the hole transport component is a polymer and the electron transport component is a small molecule. For instance, a colloid can include a polymer component and a small molecule component in a ratio of between about 1:1 and about 3:1 in one embodiment. As previously discussed, polymer/polymer system, for instance polymer/conjugated polymer colloids are also encompassed in the present disclosure, as are single conjugated polymer colloids in which the conjugated polymer can function as both the electron transport material and the hole transport material. As such, the amount of any one specific material in a colloid can vary from 0 to 100%, depending on specific materials utilized in forming a colloid. Of course, any specific ratio of a hole transport component to an electron transport component can depend upon the specific materials involved.

When present, an electroluminescent dye will generally be provided in a colloid in an amount of less than about 1% by weight of the colloid, for instance less than about 0.5% by weight, in one embodiment. The optimization of relative proportions of materials used is well within the ordinary skill level of one in the art, however, and as such is not discussed at length herein.

Other materials can be incorporated into a colloid as well. For instance hole blocking materials such as phenanthroline or its derivatives, triazole or its derivatives, aluminum complex (BAlq) with 5 ligands, an aligoarylene derivative, a styryl type compound, quinazoline or its derivatives, oxadiazole or its derivatives, pyrimidine or its derivatives, triazine or its derivatives, boron-containing compounds, and the like, can be incorporated in a colloid. A hole blocking material can inhibit migration of holes injected from the anode.

A colloid can also incorporate an electron blocking material, for instance an organic electron blocking material such as triarylamines or benzidene. Other suitable electron blocking materials as may be utilized in disclosed colloids are described in U.S. Pat. No. 7,078,113 to Thompson, et al., which is incorporated herein by reference.

The preferred amount of a hole blocking or electron blocking material in any embodiment will generally depend upon the characteristics of the particular system, as is generally known in the art. For instance, in one embodiment, the amount of a hole blocking or electron blocking material can be equal to or converse to the amount of the hole transport or electron transport material, respectively. However, these levels are not a requirement of disclosed systems, and any system can include these materials in suitable amounts as may be determined by routine experimentation according to known practices.

Following formation of an organic solution, the solution can be combined with an aqueous phase and subjected to high shear forces according to any suitable process so as to form an emulsion. For instance, the combined solutions can be subjected to sonication at a power input of greater than about 12 W for a period of time, for instance at least about 10 seconds, which can subject the mixture to high shear forces and emulsify the organic phase. Increase in the power level and/or the time of sonication can generally lead to the formation of smaller colloids.

The aqueous phase can also include a surfactant that can stabilize nascent organic droplets against collision with other droplets. In general, any cationic, anionic, zwitterionic, or nonionic water soluble surfactant can be utilized in forming the disclosed systems. Exemplary surfactants can include, without limitation, sodium dodecyl sulfate (SDS), sodium lauryl ether sulfate, cetyl tetraammonium bromide, alkyl benzene sulphonate, and the like.

Mass exchange (Ostwald ripening) between the droplets can be minimized by the use of a highly hydrophobic, organic solvent component such as chloroform ($CHCl_3$), chlorobenzene ($C_6H_5Cl$), and the like. Following formation of the emulsion, organic solvent can be vanquished, e.g., by simple evaporation, resulting in an aqueous dispersion of colloids that include all of the EL components of the original organic solution, e.g., at least one hole transport component, at least one electron transport component, and an EL dye. Beneficially, disclosed colloids are simple to form, and each individual colloid can be homogeneous in nature. For instance, colloid formation methods do not require the formation of separate layers of different materials as is common in previously known OLED materials, and formed colloids can include the same content across the entire structure.

Figure 1:
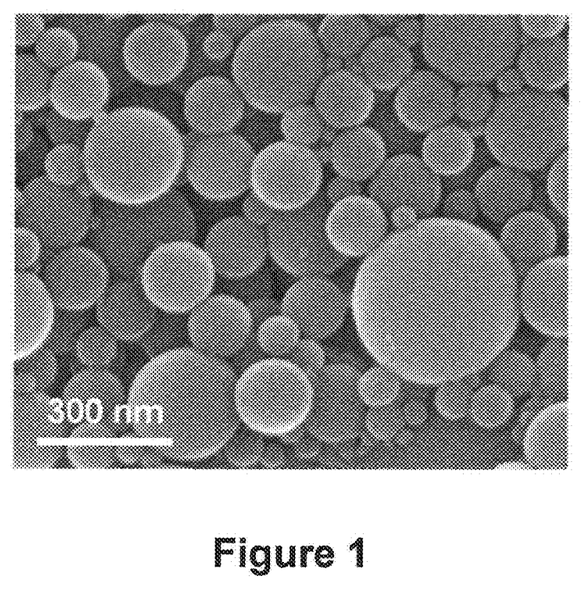
FIG. 1 is a scanning electron microscopy (SEM) image of colloids formed as described herein.

FIG. 1 is an SEM image of a colloid system as may be formed according to a miniemulsion method. As can be seen, the as-formed colloidal system can exhibit a high level of polydispersity, with individual colloids ranging in size from a few nanometers up to several hundred nanometers, or even larger in other embodiments, for instance up to about 10 microns. Such polydispersity can aid in formation of a device. For instance, during a film formation process, the smaller colloids can fill voids around larger colloids, leading to fewer vacancies in a layer and improved conductivity. Surprisingly, fabrication of devices including thin films of disclosed colloid systems can provide low occurrence of short circuits as might be expected given the amount of vacant space found in any spherical packing protocol.

Figure 3:
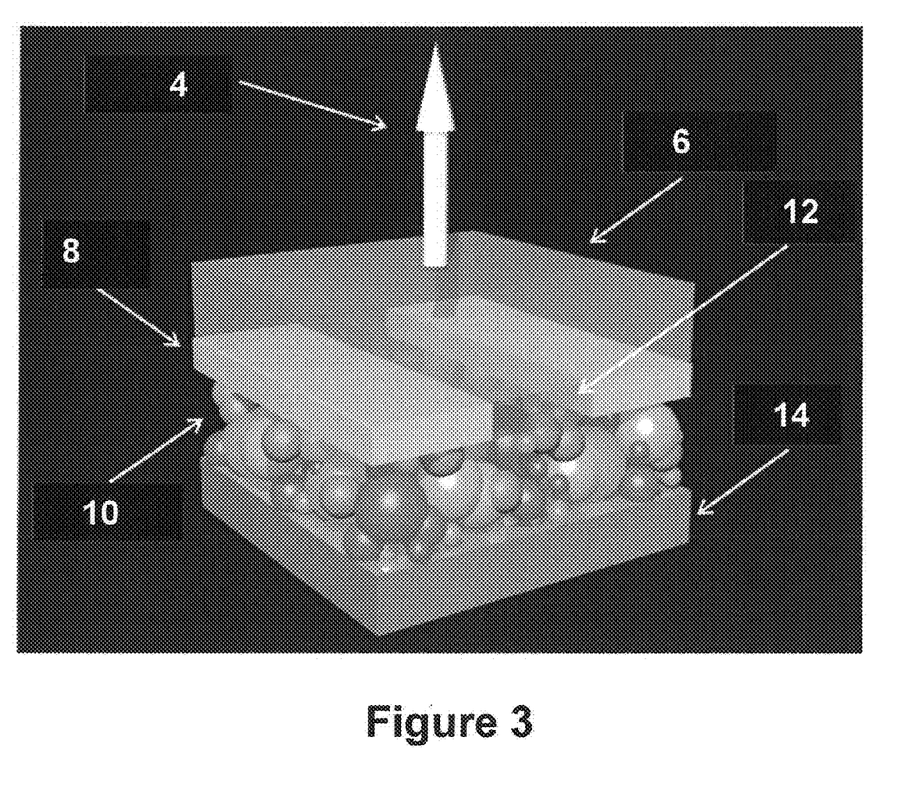
FIG. 3 is a schematic illustration of one embodiment of a single pixel device as may be formed including a colloid system as described herein.

Disclosed colloidal systems can be utilized in forming light emitting devices such as that schematically illustrated in FIG. 3. As can be seen with reference to FIG. 3, a device can include a colloid layer 10 that can include a colloidal system as described herein. A mixture of different colloids, differing as to one or more components of the individual colloids so as to differ in electroluminescent characteristics, and generally including a difference as to an electroluminescent material, can be provided, specific EL parameters of which can provide a route to tune the emissions of the layer as to, e.g., color. For example, a first colloid type, including a first EL dye, can be combined, e.g., mixed prior to film formation, with a second colloid type that is the same as the first colloid but for the inclusion of a different EL dye, to form a single layer of an emissive device. Different colloids can also include the same or different hole transport and/or electron transport materials. For example, in one embodiment, colloids of the layer 10 can include colloids formed entirely of EL conjugated polymers, or colloids formed of a conjugated polymer that provides both the electron transport and the hole transport materials, and an EL dye, as previously discussed. In the illustrated embodiment of FIG. 3, the emissive colloid-containing layer has been formed as a thin film to provide a substantially planar emissive layer in a device.

An emissive layer of a device can include materials in addition to one or more different colloid types. For instance, in addition to one or more colloidal types as described herein, an emissive layer can include an encapsulating matrix material that can contain the colloids of the dispersion. In general, a matrix material (i.e., a binder) can be translucent, and, in one preferred embodiment, transparent. For example, a matrix binder can include a transparent resistive polymer that can aide in charge transfer across the colloids of the layer. For instance, a conductive matrix material can include poly(3,4-ethylenedioxythiophene)poly(styrenesulfonate) (PEDOT: PSS), or other suitable resistive polymers as are generally known in the art including, for example, polyacetylene, polypyrrole, polyaniline and so forth. Non-conductive binder materials can also be utilized including, without limitation, poly(vinyl alcohol) (PVA), poly(butyl methacrylate) (PBMA), Joncryl 60 and Joncryl 58 (both available from BASF), and so forth.

Films including the disclosed colloidal systems can be formed according to any suitable formation process such as vacuum deposition processes, spin casting methods, printing methods, and the like. For example, a thin film including a colloidal system as described herein can be spin cast upon a substrate, e.g., glass, silicon, gallium arsenide, poly(ethylene terephthalate), and the like. A device can also include an anode 12, a cathode 14, and optionally one or more additional layers, including, without limitation, a buffer layer, a hole/electron injection layer, a hole/electron transport layer, a hole/electron blocking layer, or the like. In one embodiment, a base substrate can be formed of a material that can contribute to the electrical and/or optical functionality of the device, but this is not a requirement of the disclosed subject matter, and in other embodiments, a substrate can be merely a physical support device. For instance, in the embodiment illustrated in FIG. 3, the device includes a glass substrate layer 6.

In one embodiment, disclosed colloidal systems can be printed on a substrate according to a printing process such as, but not limited to, gravure, offset gravure, flexographic, screening, ink jet, roll to roll, and spray casting. Printing systems as may be used in disclosed processes can include multi-pass systems as may be used to form one or more layers of disclosed devices. For instance, an ink can be formed including a dispersion of a colloidal system as disclosed herein in a carrier liquid. Beneficially, disclosed colloidal systems possess excellent processability characteristics. As such, an ink can easily be prepared to include a single type of colloid or a blend of different colloids in a single carrier liquid. For instance, different colloids, e.g., colloids that differ by specific EL dye, can be prepared having the same aqueous carrier and simply mixed together in the desired proportions with little limitation as to solvent/carrier medium selection.

The concentration of the colloids in a formed ink can depend at least in part upon the printing method for which the ink is intended. In particular, the solids content of any specific type of ink can vary so as to provide the desired viscosity for that particular type of ink, as is generally known in the art. Such determinations as to solids content and corresponding viscosity are well within the capabilities of one of ordinary skill in the art.

Beneficially, the carrier liquid of an ink can be any of a wide variety of liquid vehicles, and need not be limited to those that can act as a medium during formation of the colloids. For example, in one embodiment, following formation of the colloids in an aqueous medium, the colloids can be separated from the other constituents utilized in the formation process and re-dispersed in a different carrier liquid. For instance, following formation, the colloids can be purified, via, e.g., centrifugation.

Following separation of the colloids from the aqueous medium of formation, the particles can be re-dispersed in a liquid carrier predetermined for use in a particular printing process and/or with a particular substrate or class of substrates. For example, in one embodiment, an ink can be formulated for utilization in an inkjet printing process to form a high resolution pattern on a high surface energy substrate such as a polymeric substrate or a high surface energy conductive substrate. Accordingly, the ink formulation can have a low surface tension to improve coating of the substrate. A liquid carrier can also be selected based upon the polarity of the materials forming the liquid. For instance, a nonpolar liquid carrier can provide improved coating and cohesion of the ink on a substrate. Selection of the carrier liquid can thus be utilized in forming an ink having desired properties for a particular printing method.

According to one embodiment, a liquid carrier can be water or a mixture of water and at least one water-soluble solvent (co-solvent). Selection of a suitable mixture depends on requirements of the specific application, such as desired surface tension and viscosity, drying time of the ink, and the type of substrate onto which the ink will be printed. Representative examples of water-miscible co-solvents that may be selected include alcohols, such as methyl alcohol, ethyl alcohol, n-propyl alcohol, isopropyl alcohol, n-butyl alcohol, sec-butyl alcohol, t-butyl alcohol, iso-butyl alcohol, furfuryl alcohol, and tetrahydrofurfuryl alcohol; ketones or ketoalcohols such as acetone, methyl ethyl ketone and diacetone alcohol; ethers, such as tetrahydrofuran and dioxane; esters, such as ethyl acetate, ethyl lactate, ethylene carbonate and propylene carbonate; polyhydric alcohols, such as ethylene glycol, diethylene glycol, triethylene glycol, tetraethylene glycol, propylene glycol, polyethylene glycol, glycerol, 2-methyl-2, 4-pentanediol 1,2,6-hexanetriol and thioglycol; lower alkyl mono- or di-ethers derived from alkylene glycols, such as ethylene glycol mono-methyl (or -ethyl)ether, diethylene glycol mono-methyl (or -ethyl)ether, diethylene glycol mono-butyl (or -ethyl)ether, propylene glycol mono-methyl (or -ethyl)ether, poly(ethylene glycol) butyl ether, triethylene glycol mono-methyl (or -ethyl)ether and diethylene glycol di-methyl (or -ethyl)ether; nitrogen containing cyclic compounds, such as pyrrolidone, N-methyl-2-pyrrolidone, and 1,3-dimethyl-2-imidazolidinone; and sulfur-containing compounds such as dimethyl sulfoxide, 2,2'-thiodiethanol, and tetramethylene sulfone.

In general, when a mixture of water and a water-soluble solvent is used, a liquid carrier can contain about 30% to about 95% water with the balance (i.e., about 70% to about 5%) being a water-soluble solvent. In one embodiment, a liquid carrier can include about 60% to about 95% water, based on the total weight of the liquid carrier.

An ink can include any of a variety of liquid carriers and/or additives. For example, a combination of liquid carriers can be utilized, e.g., to adjust final viscosity and/or electronic properties of the ink. Generally, any ink additive as is known in the art can be included. It can be beneficial in formulating an ink to consider the potential effects of ink additives on the resistance of the EL colloids dispersed therein. Preferred additives can depend upon the printing method for which the ink is intended as well as upon the substrates onto which the inks will be printed.

In one embodiment, an inkjet ink can be formed. Accordingly, the ink can include, in addition to the particles and a suitable liquid carrier, inkjet ink additives such as, without limitation, humectants, penetrating agents, and drying agents.

Humectants can regulate drying speed of the ink, so as to prevent drying of the ink prior to printing as well as to prevent clogging of the printhead nozzles. Exemplary humectants can include, for example, polyhydric alcohols, such as ethylene glycol, diethylene glycol (DEG), triethylene glycol, propylene glycol, tetraethylene glycol, polyethylene glycol, glycerol, 2-methyl-2,4-pentanediol, 2-ethyl-2-hydroxymethyl-1, 3-propanediol (EHMP), 1,5 pentanediol, 1,2-hexanediol, 1,2, 6-hexanetriol and thioglycol; lower alkyl mono- or di-ethers derived from alkylene glycols, such as ethylene glycol monomethyl or mono-ethyl ether, diethylene glycol mono-methyl or mono-ethyl ether, propylene glycol mono-methyl or mono-ethyl ether, triethylene glycol mono-methyl, monoethyl or mono-butyl ether (TEGMBE), diethylene glycol dimethyl or di-ethyl ether, poly(ethylene glycol) monobutyl ether (PEGMBE), and diethylene glycol monobutylether (DEGMBE); nitrogen-containing compounds, such as urea, 2-pyrrolidinone, N-methyl-2-pyrrolidinone, and 1,3-dimethyl-2-imidazolidinone; and sulfur-containing compounds such as dimethyl sulfoxide and tetramethylene sulfone, and the like.

Penetrating agents as may be incorporated in an ink can include traditional penetrating agents such as glycol ethers, e.g., diethylene glycol monobutyl ether and triethylene glycol monobutyl ether. Other suitable penetrants can include, without limitation, ethanol, isopropanol, and 2-pyrrolidone.

An ink can also include a drying agent so as to increase drying speed following the printing process. One exemplary drying agent as may be included is diethyl ether.

In one embodiment, an ink can include one or more surfactants. An exemplary listing, without limitation, of surfactants that can be incorporated in an ink can include non-ionic, amphoteric or anionic surfactants such as SURFYNOL™ surfactants, available from Air Products Corporation; SYNPERONIC™ surfactants, available from UNIQEMA; ZONYL™ surfactants, available from the DuPont Corporation; FLUORAD™ surfactants, available from the 3M Corporation; PLURONIC™ surfactants, available from BASF; Tegoglide™ and Tegowet™ surfactants, available from Goldschmidt; LOMAR™ surfactants, available from the Hinkel Corporation; AEROSOL™ surfactants, available from American Cyanamid; DOWFAX™ surfactants, available from Dow Corning; and NIAPROOF ANIONIC™ surfactants, available from Niacet.

Other ink additives can include one or more plasticizers, which can increase the flexibility of the ink and assist in maintaining adhesion of the ink to the substrate. Other additives can include one or more waxes, such as polyethylene wax, polyethylene oxide wax, polypropylene wax and fatty amides, as are generally known in the art. Waxes can improve characteristics of the printed product such as scuff resistance, rub resistance, and abrasion resistance. Silicone can be added to an ink formulation in order to increase slip of the printed materials. Conversely, it may be preferred in some embodiments to include silica in the ink formulation to reduce slip of the printed materials. Other possible additives can include biocides pH control agents, anti-foaming agents, thickeners, anti-coagulation agents, anti-corrosion agents, binders, and so on. When included, additives to an ink can generally be incorporated in standard amounts for the particular type of ink being formed.

An inkjet ink can be utilized with any inkjet printing system. Ink-jet devices typically include a printer head having one or more nozzles, each of which utilizes a static pressure ink reservoir, a small diameter orifice exiting the ink reservoir, and a voltage-gated orifice exiting the nozzle. The printer head is positioned using a two-dimensional translation mechanism. The volume of liquid dispensed in a drop is generally determined by the characteristics of the voltage-gated nozzle, while the lateral resolution of the device is usually determined by an encoder that senses the relative position of the nozzle and is controlled from a computer by a printer driver.

In another embodiment, an ink suitable for use in a flexographic printing process can be formed. Any flexographic printing system as is generally known in the art may be used with an ink incorporating disclosed colloids. For example, an ink as disclosed herein can be supplied to a flexographic system in an ink fountain. A fountain roll can deliver the ink to an anilox inking roll. The system can include a doctor blade to provide a consistent layer of ink across the anilox inking roll according to known printing methods.

An ink including disclosed colloids can be printed onto any substrate as is generally known in the art including rigid or flexible substrates, polymer or cellulose substrates, natural or synthetic substrates, laminates, and the like. Substrates that can be printed with the disclosed inks can be translucent, transparent, or opaque, as desired. Examples of substrate materials can include, without limitation, polyester (e.g., polyethylene terephthalate), paper, woven or non-woven fabric, glass, polyolefins (e.g., polypropylene), polycarbonates, polymeric composites (e.g., fiberglass), and so on.

Referring again to FIG. 3, an EL device including disclosed colloids can include any suitable electrodes as cathode 14 and anode 12, at least one of which can, in one embodiment, be transparent. For instance transparent electrodes such as an indium tin oxide (ITO) anode 12 as illustrated in FIG. 3, can be utilized. Any transparent electrode can alternatively be utilized including, without limitation, Al- and Ga-doped ZnO, $In_2O_3$ and $SnO_2$, multicomponent oxides including combinations of ZnO, $In_2O_3$ and $SnO_2$, and the like. Suitable anode materials can include thin layers of semitransparent, high work function metals such as, for example, gold. Standard non-transparent electrode materials can be utilized as well, for instance on a single side of the devices. For example, a silver cathode, a magnesium silver alloy cathode, a calcium/aluminum cathode, or other non-nontransparent cathode materials, as are generally known in the art and as illustrated in FIG. 3 at 14, can be utilized.

A device can employ additional layers, as desired. For instance, a buffer material can be provided in or as a separate layer. Other layers can include hole/electron injection layers, hole/electron transport layers, and hole/electron blocking layers as are generally known in the art.

Additional layers can be formed on a device according to any suitable process. In one embodiment, a multi-layer device can be formed according to a multi-pass printing method, wherein successive layers can be printed over one another. In one embodiment, one or more layers can be printed, while other layers can be applied according to another coating method; a spin-cast method, for example.

One or more layers of the device can optionally include thin films that can aid in planarizing the surface of the device, for instance to improve consistency of pixel illumination. For example, the embodiment illustrated in FIG. 3 includes a thin film 8 that can include an insulative material such as poly (butyl methacrylate) (PBMA) and can be applied over a surface of the device and improve device efficiency. For instance, inconsistent layer depths across a device (e.g., an anode layer that extends only partially across a surface of a substrate or the colloid-containing layer, as shown in FIG. 3) can cause inconsistent pixel illumination, particularly given the build-up of electric charge along the edges of an anode. As a thin film of emissive material can be deposited as a layer that only partially covers a surface, there can occur along the edges an extremely thin layer of the emissive material. After depositing an electrode on top of the emissive layer, already concentrated charge can have a less resistive path to flow through, causing enhanced luminance at the edges of the pixel with darker areas toward the center, and increased instances of short circuits occurring along these edges leading to early device failure. The addition of a planarizing material, e.g., any insulatory solution processable polymer such as any photoresist, poly(vinyl alcohol) (PVA), polystyrene (PS), poly (methyl methacrylate) (PMMA), poly(butyl methacrylate) (PBMA), and the like, can prevent the possibility of such situations from occurring and can improve the emission 4 from the device. Of course, a planarizing material can be added for any purpose, and not only in the embodiment described above.

Devices including a colloidal system as described herein can provide not only red, green and blue emitting devices, but the ability to create single color emitting devices over a broad range of wavelengths in the visible spectrum. Moreover, colloidally based white light emitting templated organic devices can also be formed through simple mixing of red, green and blue dye-doped colloidal dispersions. For instance, FIG. 4 illustrates the coordinates derived from the EL spectra of exemplary devices including colloid systems as described herein (described in more detail in the example section, below), and plotted according to the International Commission on Illumination.

Figure 4:
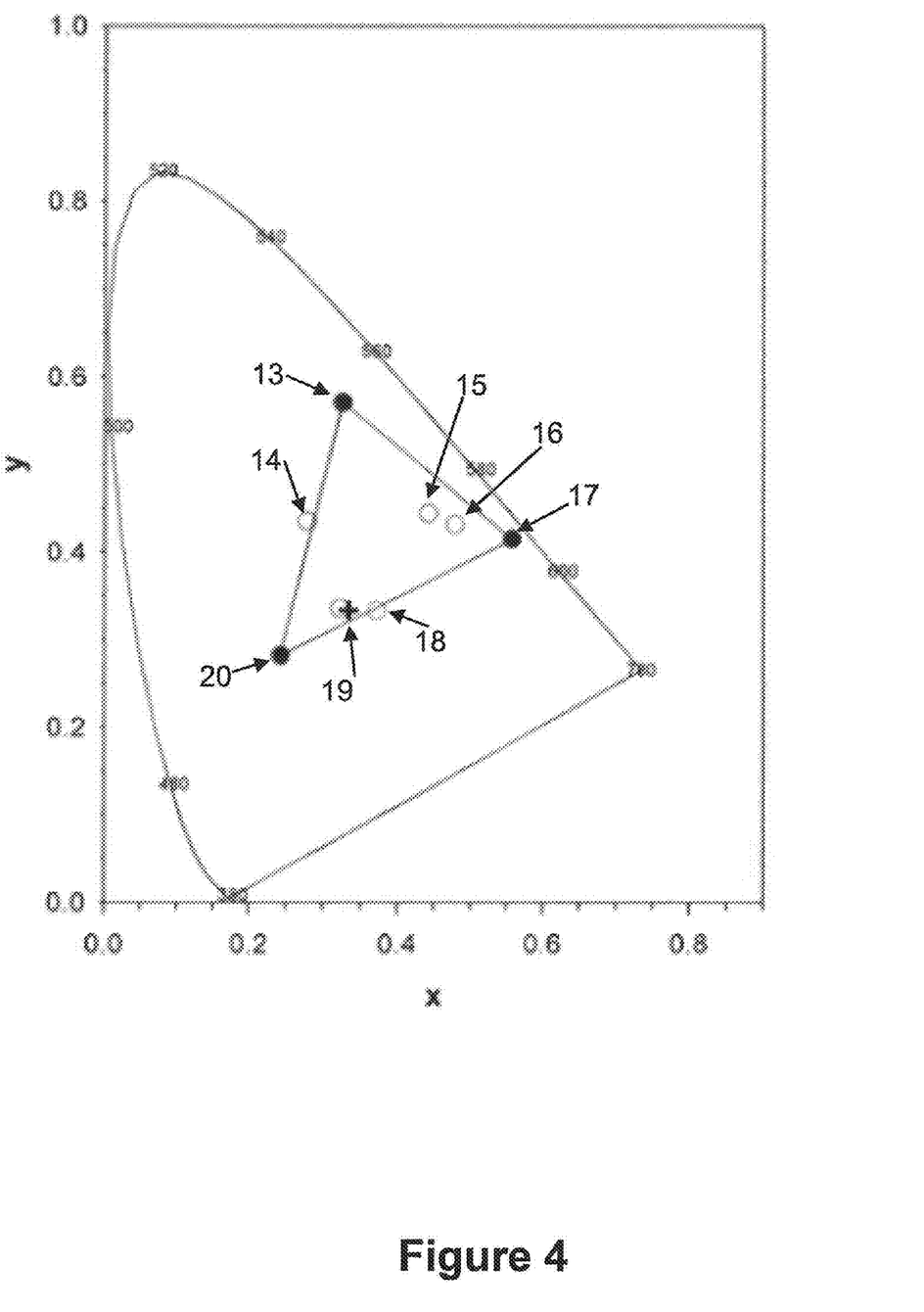
FIG. 4 illustrates the 1931 International Commission on illumination (CIE) chromaticity diagram including the EL derived color coordinates of devices as described herein shown on the plot; the outer gamut on the plot represents the single wavelength line that defines all colors perceivable to the human eye, according to the CIE.

Referring to FIG. 4, points 13-20 plot emissions obtained from devices including colloid systems as described herein. The systems include various combinations of colloids, each colloid containing one of the three dyes. Points 13, 17, and 20 are from devices including colloids incorporating only a single dye. Specifically, point 13 is the emission of a colloid system in which all of the colloids of the system include only a green EL dye, point 17 is the emission of a colloid system, all of the colloids of which include a red EL dye, and point 20 is the emission of a colloid system, all of the colloids of which include a blue EL dye. A triangle drawn over the CIE plot connecting the three primary color emitting colloidal systems (13, 17, 20, as shown) illustrates that upon combination of the three different colloids in appropriate ratios, any color lying within this triangle is achievable for devices, defining the color gamut for these materials.

The range of tailorable emissions will generally be limited only by the choice of EL dyes; in the illustrated case of FIG. 4 that range being equivalent to about 420 to 600 nm, encompassing most of the visible range. However, this tailorable range is not limited by any synthetic protocols or even the engineering of the materials, but it can be limited by the choice of materials used in the formation of the PLED colloids. For instance, utilization of different dyes in combination with different hole and electron transport components in forming a mixture of colloids can alter the emission range of a device incorporating such colloids. For example, utilization of colloid components characterized by absorbance falling deeper in the ultraviolet (UV) coupled with a blue EL dye with a maximum emission closer to 400 nm can serve to broaden the gamut, as will a red EL dye with a maximum emission higher in the 600 nm range.

Reference now will be made to various embodiments of the invention, one or more examples of which are set forth below. Each example is provided by way of explanation of the invention, not as a limitation of the invention.

Example 1

Colloid systems were formed including a polymeric hole-transport component (poly(9-vinylcarbazole), (PVK)), an electron-transport component (2-(4-tert-Butylphenyl)-5-(4-biphenylyl)-1,3,4-oxadiazole, (PBD, CAS no. 15082-28-7)), and several interchangeable EL dye components: blue light-emitting 7-Diethylamino-4-methylcoumarin (C1), green light-emitting Coumarin 6 (C6), and red light-emitting Nile Red (NR).

The general procedure for the preparation of PLED colloids used a miniemulsion technique beginning with the preparation of a mixed solution of PLED components: 2.06 wt % PVK, various amounts of the chosen EL dye, e.g., 0.66 wt % C1, 0.66 wt % C6, 0.30 wt % NR, and 1.69 wt % PBD in 2 g (1.43 mL) $CHCl_3$. The $CHCl_3$-based solution was then mixed with an aqueous solution containing sodium dodecyl sulfate (SDS, 1 wt % in 5 g $H_2O$).

Shearing of the clear binary solution, using ultrasonic power (12 W), resulted in an immediate change to a turbid solution. After sonication exposure (240 s), the remaining $CHCl_3$ was evaporated (60° C. with stirring, 3 h) yielding an aqueous PLED colloidal dispersion.

The as-formed colloid dispersion was cleaned prior to formation of an EL device. Dialysis bags with 50,000 molecular weight cut-off were charged with about 15 mL of the emulsion and placed in 17 L of 60° C. water to encourage the migration of residual small molecule, dye and surfactant into the excess water through the concentration (chemical potential) gradient. The deionized water was purified to a resistivity of 18.2 MΩ-cm and was changed every 12 hours until the conductivity of the water was consistently less than 0.5 $\mu Scm^{-1}$.

An exhaustive dialysis was performed on all of the formed PLED colloidal dispersions. Thus, it was inferred that the observed photoluminescent (PL) and EL emissions were solely attributable to dye molecules embedded within the colloids. Thermogravimetric analysis (TGA) of the dried, undoped colloidal dispersions revealed concentrations of the hole and electron transport components to be consistent with concentrations known to provide balanced charge injection into and transport through the emissive material for optimal device performance in previously known thin film systems, in which the hole and electron transport components and the EL dye are simply mixed, dissolved in an organic solvent, spin cast onto a device substrate to a working thickness of about 100 nm and covered with a metallic cathode.

It was observed that under the initial concentrations in the miniemulsion procedure, the final colloid composition was about 72% PVK and about 28% PBD by weight, allowing for sufficient hole and electron transport for the production of visible light. Actual dye concentration within the polymer colloids was not determined.

Absorbance and PL spectroscopy measurements were conducted on the aqueous PLED colloidal dispersions. Absorbance spectra of the dyes alone in solution showed pronounced peaks, however once encapsulated, the absorbance of the dyes was completely overshadowed by the absorption characteristics of the PVK and PBD electronic transport materials. Within the colloids, there did exist energetic communication, however in this case this energy transfer supported device function and was illustrated by PL emission.

Figure 2:
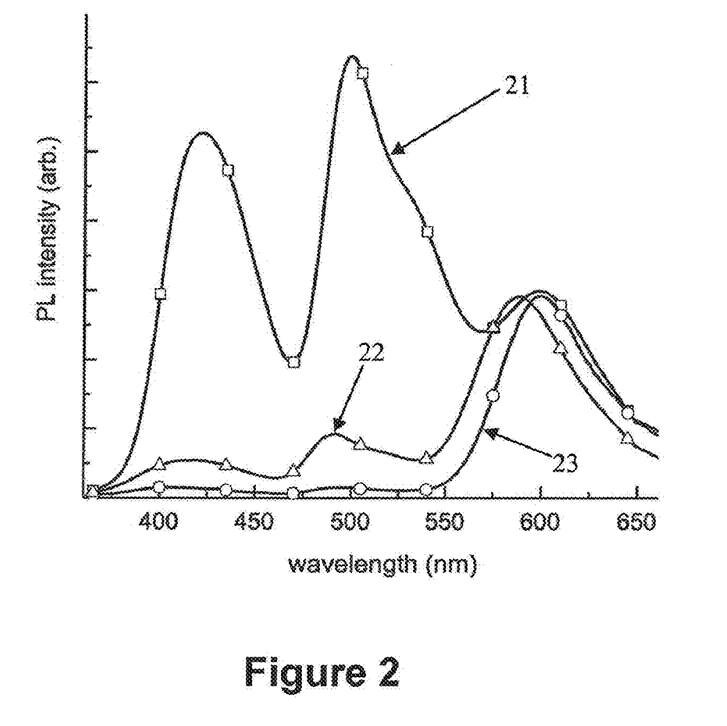
FIG. 2 illustrates photoluminescent spectra of colloids as described herein as may be utilized in forming a PLED.

PL measurements of aqueous PLED colloidal dispersions doped with three different EL dyes are illustrated in FIG. 2. Line 21 (squares) illustrates the PL measurements of a white light producing colloid composition and line 23 (circles) illustrates a thin film device including a mixture of red, green and blue dyes (excitation wavelength was 343 nm).

Measurements revealed pronounced independent PL dye emissions in solution (C1, $\lambda_{em}$=420 nm, C6, $\lambda_{em}$=500 and 555 nm, and NR, $\lambda_{em}$=600 nm). Each independent emission was acquired by exciting the PVK only (absorbance of about 343 nm), both in individual dispersions and in an RGB mixture comprising 1 part of each dispersion. As can be seen, the PL spectrum of the mixed colloidal thin film including the three EL dye containing colloidal PLED dispersions shows multiple, independent emissions without any appreciable energy transfer (21), whereas a simple mixture of all three EL dyes in the presence of the electronic transport components, dissolved in $CHCl_3$ and spin cast into a thin film illustrates this energetic communication (23), as all energy is concentrated to the lowest energy emitter, the red EL dye, and any emission from the blue or green EL dyes is lost.

The colloidal film was subjected to thermal treatment (80° C. for 10 min on a hotplate) to partially melt the EL colloids. Measurements of the partially melted colloidal film (line 22, triangles) show partial energy transfer from blue to green and finally to the red EL dye molecules.

As can be seen in FIG. 2, sequestering an EL dye component into distinct PLED colloids with no appreciable energy transfer between colloids affords the ability to create tailored emissions over a broad range of wavelengths by simply mixing red, green and blue PLED dispersions in predetermined ratios.

Scanning Electron Microscopy (SEM) techniques (FIG. 1) revealed the success of the miniemulsification of commercially available polymer, small molecule and dye components, as well as the polydispersity of the colloidal suspensions.

Example 2

Colloid systems formed as described in Example 1 were utilized to form a single pixel device, similar to that illustrated in FIG. 3.

To form the devices, ITO coated 12.5 $mm^2$ float glass substrates (available from Delta Technologies of Stillwater, Minn., USA) were etched to a 4×12.5 mm rectangular pattern and cleaned. A PBMA solution was polymerized via emulsion polymerization, dried and re-dissolved in $CHCl_3$ to a concentration of 25 mg/mL. The solution was then spin cast onto the substrate to a working thickness of about 150 nm and then removed from the ITO area with a cotton tipped applicator soaked with $CHCl_3$.

A prepared EL colloid dispersion was then spin cast onto the substrate to a thickness of between about 100 nm and about 150 nm.

Figure 5:
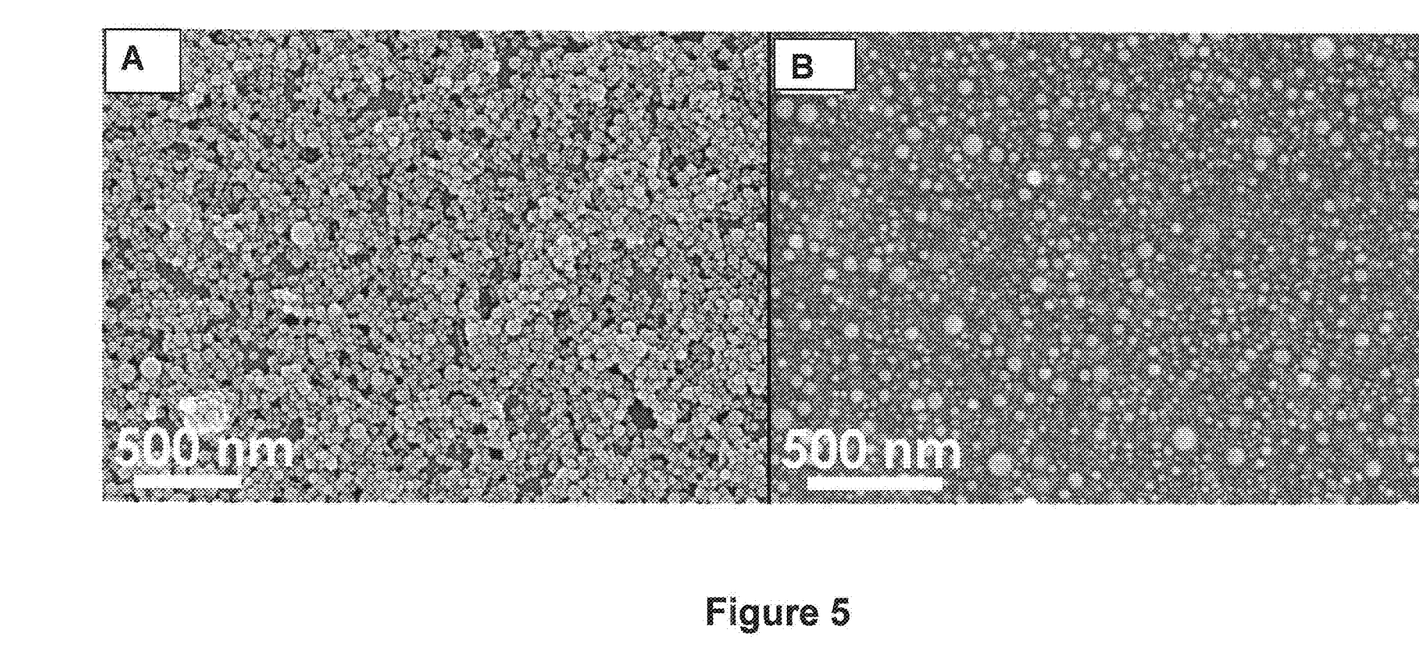
FIG. 5A is an SEM of a spin cast film of a miniemulsion-formed colloid system as described herein and showing exposed areas of indium tin oxide (ITO) anode beneath the film.
FIG. 5B is an SEM of a spin cast film of a miniemulsion-formed colloid system as described herein embedded in a PEDOT:PSS continuous film.

FIG. 5A illustrates a device including a spin cast film of a colloidal system as described above. As can be seen, even under ideal conditions, i.e., a relatively thick deposition in which numerous smaller (e.g., 20-80 nm) colloids have filled vacancies around the larger colloids, a number of vacancies remain that can expose areas of the ITO anode beneath the film. Upon deposition of the cathode, material (e.g., calcium) can collect in the vacancies and contact the anode directly, which could detrimentally affect performance of the device.

FIG. 5B illustrates a device including the addition of a resistive polymer to the emissive layer so as to fill any vacancies. Specifically, PEDOT:PSS (Baytron® P formulation VP CH 8000, ($\rho_v$=1×10$^5$ Ω-cm), H.C. Starck, Inc.)) was added to the colloidal suspension, concentrated by rotational evaporation, and the prepared mixture was spin cast onto an ITO anode to a working thickness of about 100 to about 150 nm. The addition of the PEDOT:PSS eliminated the occurrence of short circuits as well as aided in hole injection into the colloids, which allowed for enhanced charge mobility.

A calcium electrode was thermally evaporated onto the emissive polymer layer via resistive evaporation techniques at a slow deposition rate (less than about 5 Å/s) and then capped with a thermally evaporated aluminum layer.

Device templating to form Tiger Paw logo-shaped devices (FIG. 6A) was carried out utilizing standard photolithography techniques with a positive photoresist. Specifically, ITO was coated on 25 $mm^2$ float glass and removed from three sides of the substrate. Positive photoresist (PR, HPR 504) was cast, patterned and baked to withstand subsequent thin film depositions. The patterned PR and exposed ITO surface was then plasma treated for further cleaning and wettability of the ITO. The EL mixture was then spin cast over the exposed ITO and a metallic cathode was deposited as described above.

In order to achieve the patterned light emission, it proved favorable to simply leave the photoresist on the device substrate after the hard bake step and fill the exposed cavity with the EL mixture. The non-conductive nature of the photoresist polymer served as a buffer between the two electrodes and forced all current flow to travel through the EL polymeric colloid/PEDOT:PSS mixture providing a patterned EL device. The inherent adversity of the positive photoresist to ultraviolet light didn't allow for considerable device lifetimes, however other nonconductive, optically transparent polymeric materials can be used in this manner rather simply and with similar results.

Characterization of finished devices was carried out in an argon atmosphere to prevent any adverse reactions that could occur during device function. Device testing was a voltage-controlled process, with current and luminance data being recorded in 1V increments and plotted as a function of voltage. Once a maximum luminance was established, typically 10-15 cdm$^{-2}$ at a particular voltage, typically 9 to 13V, devices were operated continuously at this voltage for the acquisition of electroluminescent (EL) spectra and visual photography (see FIGS. 6A and 6B).

Figure 6A:
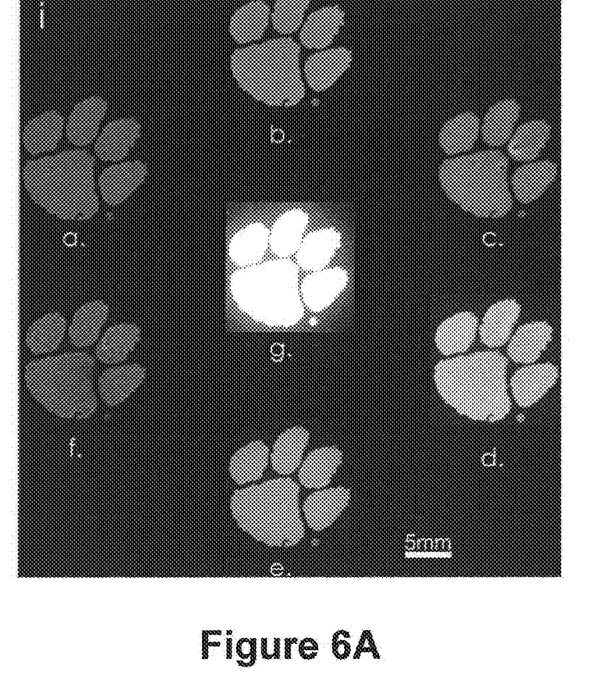
FIG. 6A includes photographs of light emitting devices formed as described herein displaying red (a), orange (b), green (c), cyan (d), blue (e), purple (f) and white (g) light.
Figure 6B:
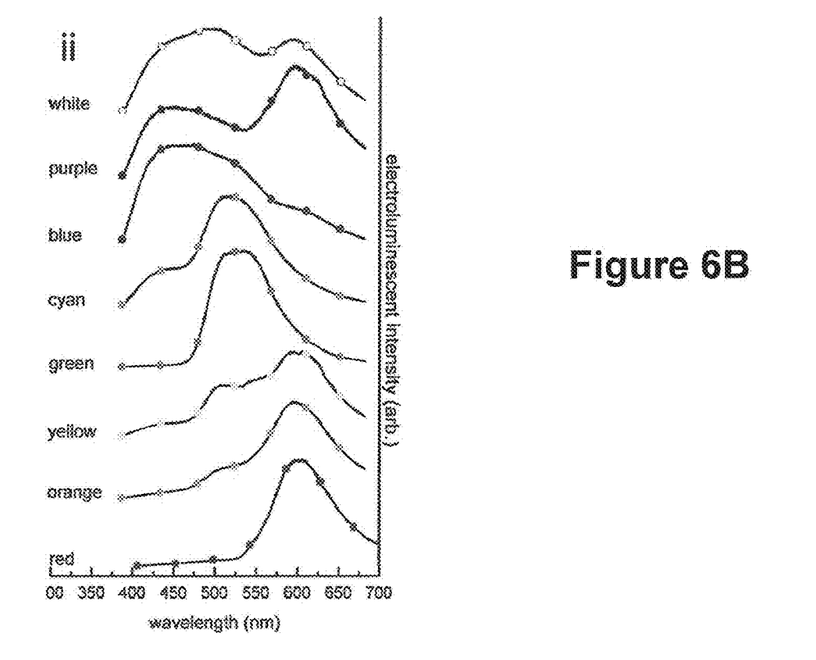
FIG. 6B illustrates the electroluminescent spectra of light emitting devices formed as described herein, including those pictured in FIG. 6A.

FIG. 6A illustrates device photographs including red (a), orange (b), green (c), cyan (d), blue (e), purple (f), and white (g) light emitting devices formed from mixtures of red, green and blue dye-doped colloidal dispersions. FIG. 6B illustrates EL spectra of devices of FIG. 6A with the addition of a yellow device not pictured. Coordinates in CIE space were then calculated and plotted to show color tailoring according to the color matching function of 1931. Points 13, 17, and 20 on FIG. 4 illustrate the CIE coordinates of the green, red, and blue devices, respectively, each of which included colloid systems incorporating only those single dyes. The other points of FIG. 4 illustrate the CIE coordinates of other devices formed that included a mixture of different colloids, i.e., a mixture of colloids incorporating different dyes. Specifically, point 15 of FIG. 4 designates a yellow device, point 16 designates an orange device, point 14 designates cyan, and point 18 designates purple. Point 19 represented a white device.

Example 3

A flexographic ink was formulated including 1.0 g of the aqueous dye-doped colloidal dispersion described above in Example 1 and adding 0.5% SDS (w/w) to decrease the surface tension of the dispersion. The colloidal solution (500 µL) was added to a printing medium (44004) composed of 22.7% (v/v) PEDOT:PSS, 68.2% (v/v) polyvinyl alcohol) (PVA), 9.1% (v/v) ethylene glycol, an 0.5% (v/w) SDS to form the final printing ink.

Printing of the ink was done on a Flexiproof® 100 print Proofer (available from Testing Machines, Inc., Ronkonkoma, N.Y., USA) operated at a feed rate of 25 m/min. A digitally imaged DuPont DFH plate with a caliper of 0.17 cm was thermally developed using a DuPont FAST processor. For transfer of the formulated ink from the doctor blade to the flexographic plate, a 1381 pi/11.7 bcm anilox roller was used. Printing substrates were ITO-coated polyethylene terephthalate) (PET) films available from CP Films (Martinsville, Va., USA).

Figure 7:
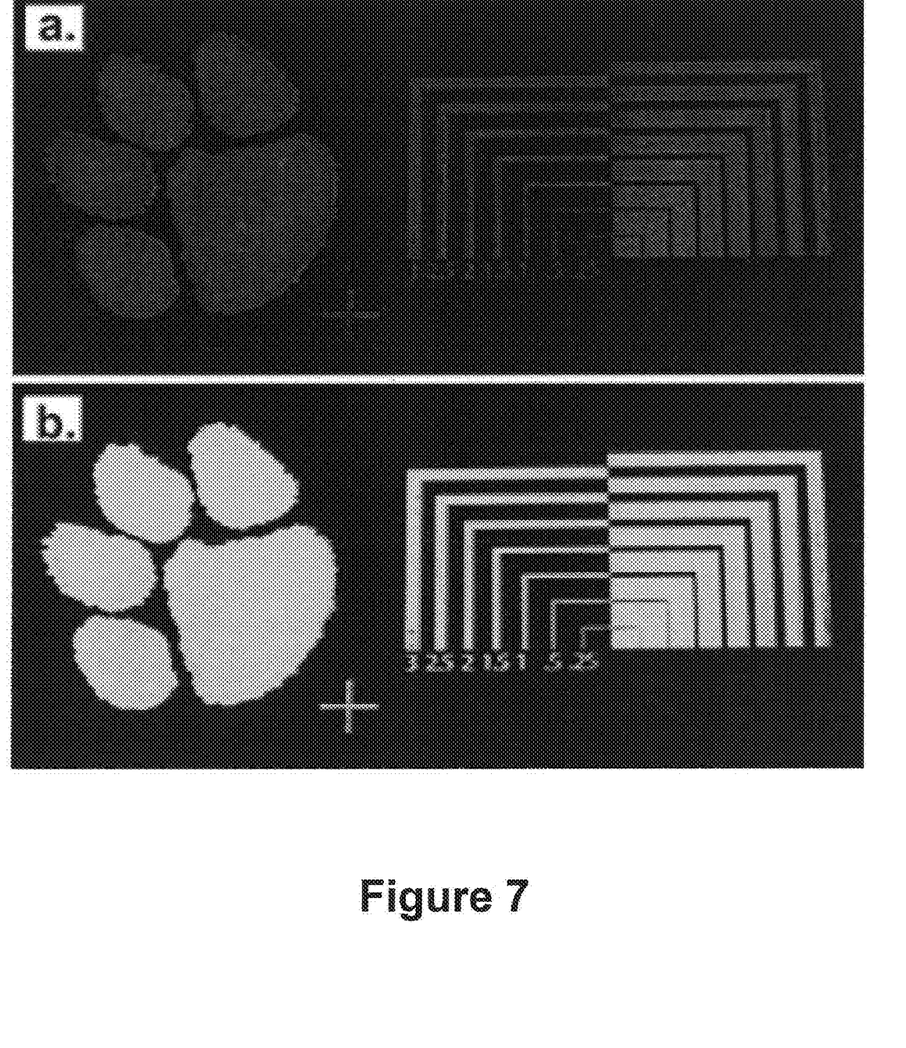
FIG. 7 includes optical images of a flexographically printed image formed as described herein; the printed zone is illuminated with ambient laboratory light (FIG. 7A) and a 365 nm source (FIG. 7B).

FIG. 7 provides optical images of a flexographically printed image formed with an ink formed exclusively with green dye derived colloids. FIG. 7A is the image under ambient laboratory light, which appeared gray, and FIG. 7B is the same image under a 365 nm source in which the luminescent green shape was clearly visible. The line widths are presented in Postcript points (1 Postcript point=0.3528 mm).

It will be appreciated that the foregoing examples, given for purposes of illustration, are not to be construed as limiting the scope of this disclosure. Although only a few exemplary embodiments have been described in detail above, those skilled in the art will readily appreciate that many modifications are possible in the exemplary embodiments without materially departing from the novel teachings and advantages of this disclosure. Accordingly, all such modifications are intended to be included within the scope of this disclosure. Further, it is recognized that many embodiments may be conceived that do not achieve all of the advantages of some embodiments, yet the absence of a particular advantage shall not be construed to necessarily mean that such an embodiment is outside the scope of the present invention.

What is claimed is:

1. An electroluminescent colloid comprising:
  a hole transport component;
  an electron transport component; and
  an electroluminescent material
   wherein at least one of the hole transport component and the electron transport component is a polymer, the electroluminescent colloid defining a diameter between about 20 and about 500 nm, the electroluminescent colloid being homogeneous.

2. The electroluminescent colloid of claim 1, wherein the electroluminescent material is an electroluminescent dye.

3. The electroluminescent colloid of claim 1, wherein the polymer is a conjugated polymer.

4. The electroluminescent colloid of claim 1, wherein one of the hole transport component and the electron transport component is a polymer and the other of the hole transport component and the electron transport component is a small molecule.

5. The electroluminescent colloid of claim 4, wherein the polymer is a conjugated polymer.

6. The electroluminescent colloid of claim 1, wherein the electron transport component is a first polymer and the hole transport component is a second polymer.

7. The electroluminescent colloid of claim 1, the electroluminescent colloid comprising only a single electroluminescent material.

8. A method of forming the electroluminescent colloid of claim 1, the method comprising:
  forming in a solvent a solution including the hole transport component, the electroluminescent material, and the electron transport component;
  combining the solution with an aqueous phase to form a biphasic mixture; and
  subjecting the biphasic mixture to high shear forces such that the electroluminescent colloid is formed, wherein the electroluminescent colloid emits at a first wavelength.

9. The method according to claim 8, further comprising removing the solvent from the electroluminescent colloid.

10. The method according to claim 9, further comprising separating the electroluminescent colloid from the aqueous phase.

11. The method according to claim 8, wherein the electroluminescent material is an electroluminescent dye.

12. The electroluminescent colloid of claim 1, wherein the hole transport component exhibits a hole mobility greater than about $10^{-3}$ $cm^2V^{-1}$ $s^{-1}$.

13. The electroluminescent colloid of claim 1, wherein the electron transport component exhibits a mobility between about $10^{-3}$ and about $10^{-1}$ $cm^2V^{-1}$ $s^{-1}$.

14. The electroluminescent colloid of claim 1, wherein the hole transport component is a small molecule selected from the group consisting of 4,4'-bis[N-(naphthyl)-N-phenyl-amino]biphenyl; N,N'-bis(3-methylphenyl)-N,N'-diphenyl-[1,1'-biphenyl]4,4'-diamine; 4,4'-bis[N-(2-naphthyl)-N-phenyl-amino]biphenyl; 4,4'-bis[N,N'-(3-tolyl)amino]-3,3'-dimethylbiphenyl, 4,4',4"-tris(3)methylphenylphenylamino)triphenylamine; 3,3'-Dimethyl-$N^4,N^4,N^{4'},N^{4'}$-tetra-p-tolylbiphenyl-4,4'-diamine; N,N'-meta-dicarbazoloylbenzene; N,N',N"-1,3,5-tricarbazoloylbenzene; and 4,4'-N,N'-dicarbazole-biphenyl.

15. The electroluminescent colloid of claim 1, wherein the electron transport component is a small molecule selected from the group consisting of aryl-substituted oxadiazole, aryl-substituted triazole, aryl-substituted phenanthroline, benzoxazole or benzothiazole compounds, 1,3-bis(N,N-t-butyl-phenyl)-1,3,4-oxadiazole; 3-phenyl-4-(1'-naphthyl)-5-phenyl-1,2,4-triazole; 2,9-dimethyl-4,7-diphenyl-phenanthroline; bis(2-(2-hydroxyphenyl)-benzoxazolate)zinc; (2-(2-hydroxyphenyl)-benzothiazolate)zinc; (2-(4-tert-butylphenyl)-5-(4-biphenylyl)-1,3,4-oxadiazole (PBD); and aluminum tris(8-hydroxyquinolate).

\* \* \* \* \*

UNITED STATES PATENT AND TRADEMARK OFFICE
CERTIFICATE OF CORRECTION

PATENT NO. : 8,003,008 B1
APPLICATION NO. : 12/247270
DATED : August 23, 2011
INVENTOR(S) : Christopher F. Huebner et al.

It is certified that error appears in the above-identified patent and that said Letters Patent is hereby corrected as shown below:

Specification

Column 1, lines 17 - 20 please correct -- "The United States Government may have rights in this invention pursuant to CAREER Award Grant #20-201-5100-206-2003498 and National Science Foundation Contract #DMR-0236692." -- to read -- "This invention was made with government support under CAREER Award Grant #20-201-5100-206-2003498 and NSF Contract #DMR-0236692. The government has certain rights in the invention, 37 CFR 401.14(f)(4)." --

Signed and Sealed this
Twenty-fourth Day of November, 2015

Michelle K. Lee
*Director of the United States Patent and Trademark Office*